(12) United States Patent
Chen et al.

(10) Patent No.: US 8,716,801 B2
(45) Date of Patent: May 6, 2014

(54) METAL OXIDE SEMICONDUCTOR DEVICE

(75) Inventors: Lu-An Chen, Keelung (TW); Chang-Tzu Wang, Taoyuan County (TW); Tai-Hsiang Lai, Hsinchu (TW); Tien-Hao Tang, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 287 days.

(21) Appl. No.: 13/353,235

(22) Filed: Jan. 18, 2012

(65) Prior Publication Data
US 2013/0181211 A1    Jul. 18, 2013

(51) Int. Cl.
*H01L 23/62* (2006.01)
(52) U.S. Cl.
USPC ..... 257/355; 257/173; 257/546; 257/E29.225
(58) Field of Classification Search
CPC ............ H01L 27/0266; H01L 27/0255; H01L 27/0251; H01L 27/1214
USPC ................... 257/173, 355–360, 546, E29.225
See application file for complete search history.

(56) References Cited

U.S. PATENT DOCUMENTS

| | | | |
|---|---|---|---|
| 5,637,900 A | 6/1997 | Ker et al. | |
| 5,959,820 A | 9/1999 | Ker et al. | |
| 6,016,002 A | 1/2000 | Chen et al. | |
| 6,724,677 B1 | 4/2004 | Su et al. | |
| 6,909,149 B2 | 6/2005 | Russ et al. | |
| 7,009,252 B2 | 3/2006 | Lin et al. | |
| 7,027,276 B2 | 4/2006 | Chen | |
| 7,205,612 B2 | 4/2007 | Cai et al. | |
| 7,368,761 B1 | 5/2008 | Lai et al. | |
| 7,672,100 B2 | 3/2010 | Van Camp | |
| 7,880,234 B2 * | 2/2011 | Cheng et al. | .................. 257/355 |
| 2003/0076636 A1 | 4/2003 | Ker et al. | |
| 2006/0267102 A1 | 11/2006 | Cheng et al. | |
| 2013/0181211 A1 * | 7/2013 | Chen et al. | ...................... 257/43 |

OTHER PUBLICATIONS

Lai et al., "High-robust ESD protection structure with embedded SCR in high-voltage CMOS process", IEEE CFP08RPS-CDR 46th Annual International Reliability, Physics Symposium, 2008,627~628, Phoenix.

* cited by examiner

*Primary Examiner* — Jack Chen
(74) *Attorney, Agent, or Firm* — J.C. Patents

(57) ABSTRACT

Provided is a metal oxide semiconductor device, including a substrate, a gate, a first-type first heavily doped region, a first-type drift region, a second-type first heavily doped region, a contact, a first electrode, and a second electrode. The gate is disposed on the substrate. The first-type first heavily doped region is disposed in the substrate at a side of the gate. The first-type drift region is disposed in the substrate at another side of the gate. The second-type first heavily doped region is disposed in the first-type drift region. The contact is electrically connected to the second-type first heavily doped region. The contact is the closest contact to the gate on the first-type drift region. The first electrode is electrically connected to the contact, and the second electrode is electrically connected to the first-type first heavily doped region and the gate.

16 Claims, 3 Drawing Sheets

METAL OXIDE SEMICONDUCTOR DEVICE

BACKGROUND OF THE INVENTION

1. Field of Invention

The present invention relates to a metal oxide semiconductor (MOS) device, and more generally to a MOS device for electrostatic discharge (ESD) protection.

2. Description of Related Art

ESD is a phenomenon in which charges are accumulated on a non-conductor or a non-grounded conductor and then suddenly transfer and discharge through a discharge path. The circuits in ICs can be damaged by ESD. For example, a charge carrying object, such as a human body, a machine for packaging ICs or an apparatus for testing ICs, can discharge to an IC chip when the charge carrying object is in contact with the IC chip. Thus, the IC chip is damaged or broken by the transient power of ESD.

The conventional ESD protection device can be constructed with an ESD clamp circuit. Alternatively, the ESD protection device can be constructed with a silicon controlled rectifier (SCR) without using an ESD clamp circuit. However, it is more difficult to trigger a SCR. That is, the SCR requires a higher trigger voltage. Therefore, it is observed frequently that the device in the circuit is damaged before the SCR is activated. Accordingly, the ESD protection function can not be effectively achieved.

SUMMARY OF THE INVENTION

The present invention provides a MOS device to achieve the excellent ESD protection effect without using an ESD clamp circuit.

The present invention provides a MOS device including a substrate, a gate, a first-type first heavily doped region, a second-type first heavily doped region, a first-type drift region, a contact, a first electrode and a second electrode. The gate is disposed on the substrate. The first-type first heavily doped region is disposed in the substrate at a side of the gate. The first-type drift region is disposed in the substrate at another side of the gate. The second-type first heavily doped region is disposed in the first-type drift region. The contact is electrically connected to the second-type first heavily doped region, wherein the contact is the closest contact to the gate on the first-type drift region. The first electrode is electrically connected to the contact. The second electrode is electrically connected to the first-type first heavily doped region and the gate.

According to an embodiment of the present invention, the second-type first heavily doped region is a strip-shaped doped region.

According to an embodiment of the present invention, the MOS device further includes a first-type second heavily doped region disposed in the first-type drift region, wherein the second-type first heavily doped region is located between the first-type second heavily doped region and the gate.

According to an embodiment of the present invention, the second-type first heavily doped region is a ring-shaped doped region surrounding the first-type second heavily doped region.

According to an embodiment of the present invention, the first electrode is electrically connected to the first-type second heavily doped region.

According to an embodiment of the present invention, the MOS device further includes a first-type third heavily doped region disposed in the first-type drift region and located between the gate and the second-type first heavily doped region.

According to an embodiment of the present invention, no contact is disposed on the first-type third heavily doped region.

According to an embodiment of the present invention, the MOS device further includes an insulating layer disposed in the substrate and in the first-type drift region and located between the gate and the first-type third heavily doped region.

According to an embodiment of the present invention, the insulating layer is a field oxide layer.

According to an embodiment of the present invention, the MOS device further includes a second-type second heavily doped region disposed in the substrate, wherein the second-type second heavily doped region and the first-type first heavily doped region located at the same side of the gate, and the first-type first heavily doped region is located between the second-type second heavily doped region and the gate.

According to an embodiment of the present invention, the second electrode is electrically connected to the second-type second heavily doped region.

According to an embodiment of the present invention, the substrate is a second-type substrate; the first-type first heavily doped region, the substrate and the first-type drift region form a first bipolar junction transistor, and the substrate, the first-type drift region and the second-type first heavily doped region form a second bipolar junction transistor.

According to an embodiment of the present invention, the first bipolar junction transistor and the second bipolar junction transistor form a silicon controlled rectifier.

According to an embodiment of the present invention, the substrate is a first-type substrate, and the MOS device further includes a second-type well region disposed in the substrate, wherein the first-type first heavily doped region, the second-type first heavily doped region and the first-type drift region are disposed in the second-type well region.

According to an embodiment of the present invention, the first-type first heavily doped region, the second-type well region and the first-type drift region form a first bipolar junction transistor, and the second-type well region, the first-type drift region and the second-type first heavily doped region form a second bipolar junction transistor.

According to an embodiment of the present invention, the first bipolar junction transistor and the second bipolar junction transistor form a silicon controlled rectifier.

In view of the above, in the MOS device of the present invention, the excellent ESD protection effect can be provided, the ESD current can be distributed evenly, and generation of hot spots in the MOS device can be avoided. Therefore, the MOS device of the present invention can meet the high ESD standard.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
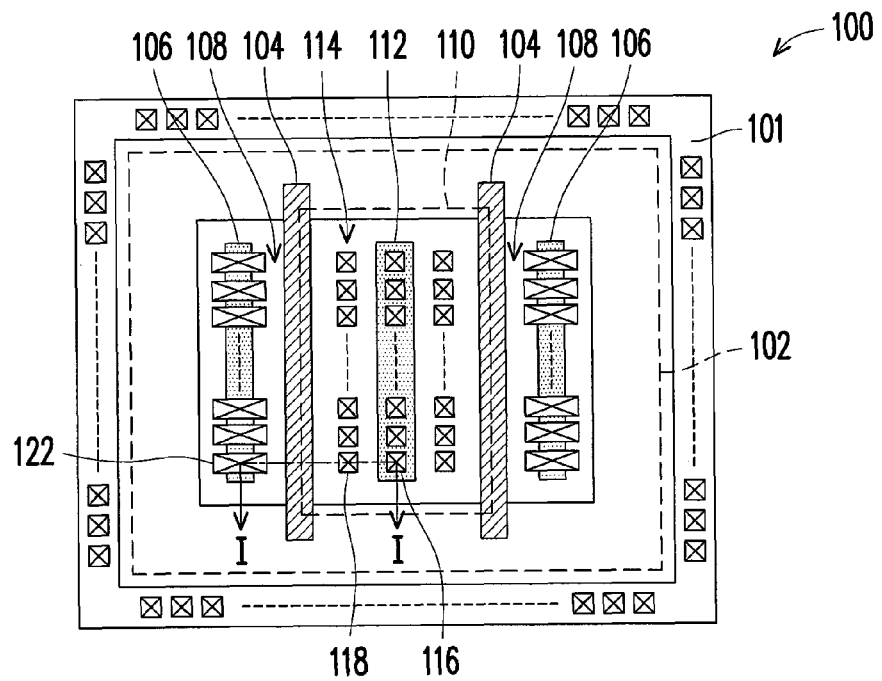
FIG. 1A illustrates a top view of a MOS device according to a first embodiment of the present disclosure.

Reference will now be made in detail to the present preferred embodiments of the invention, examples of which are illustrated in the accompanying drawings. Wherever possible, the same reference numbers are used in the drawings and the description to refer to the same or like parts.

The terms "first-type" and "second-type" herein refer to different conductivity types and respectively denote holes (P-type) and electrons (N-type) serve as main carriers in the device. The following embodiments in which the first-type is P-type and the second-type is N-type are provided for illustration purposes, and are not construed as limiting the present disclosure. In another embodiment, the first-type can be N-type and the second-type can be P-type.

Figure 1B:
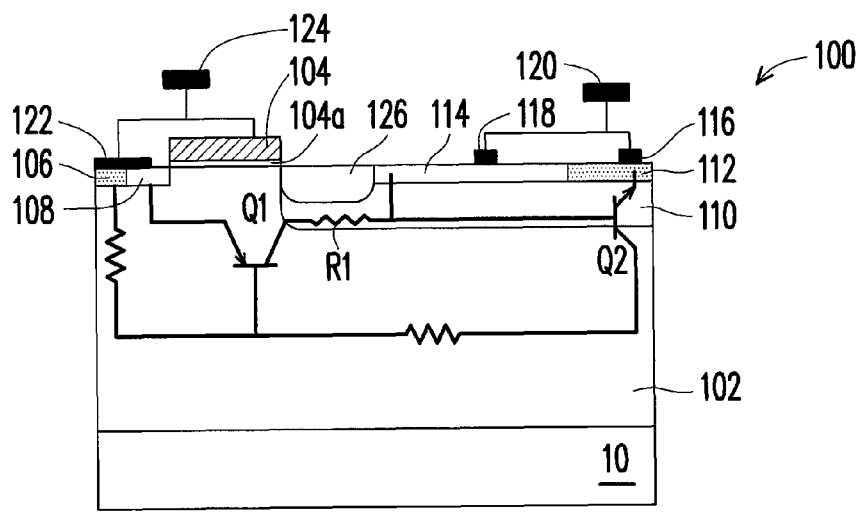
FIG. 1B illustrates a cross-sectional view taken along the line I-I in FIG. 1A.

FIG. 1A illustrates a top view of a MOS device according to a first embodiment of the present disclosure. FIG. 1B illustrates a cross-sectional view taken along the line I-I in FIG. 1A.

Referring to FIGS. 1A and 1B, a MOS device 100 of the first embodiment includes a P-type substrate 10, an N-type well region 102, a gate 104, an N-type second heavily doped region 106, a P-type first heavily doped region 108, a P-type drift region 110, an N-type first heavily doped region 112, a P-type second heavily doped region 114, a first contact 116, a second contact 118, a first electrode 120, a third contact 122 and a second electrode 124.

In the first embodiment, the P-type substrate 10 is a P-type silicon substrate, for example. The N-type well region 102 is disposed in the P-type substrate 10. In an embodiment, the dopant of the N-type well region 102 includes phosphor, and the forming method of the same includes performing an ion implantation process. The implantation energy is 1,800 KeV, the implantation depth is 1,000-8,000 nm and the dopant concentration is $4 \times 10^{12}$ cm$^{-2}$, for example.

The gate 104 is disposed on the N-type well region 102. The gate 104 includes a conductive material, such as a doped polysilicon. A gate dielectric layer 104a is further disposed between the gate 104 and the N-type well region 102. The material of the gate dielectric layer 104a is silicon oxide or a high-k material having a dielectric constant greater than 4, for example.

The N-type second heavily doped region 106 is disposed in the N-type well region 102 at a side of the gate 104. In an embodiment, the dopant of the N-type second heavily doped region 106 includes arsenic and the forming method of the same includes performing an ion implantation process. The implantation energy is 80 KeV, the implantation depth is 200 nm and the dopant concentration is $4 \times 10^{15}$ cm$^{-2}$, for example. In another embodiment, the implantation depth of the N-type second heavily doped region 106 can be less than 200 nm.

The P-type first heavily doped region 108 is disposed in the N-type well region 102 and located between the gate 104 and the N-type second heavily doped region 106. In an embodiment, the dopant of the P-type first heavily doped region 108 includes $BF_3$ and the forming method of the same includes performing an ion implantation process. The implantation energy is 55 KeV, the implantation depth is 200 nm and the dopant concentration is $4 \times 10^{15}$ cm$^{-2}$, for example. In another embodiment, the implantation depth of the P-type first heavily doped region 108 can be less than 200 nm.

The P-type drift region 110 is disposed in the N-type well region 102 at another side of the gate 104. In an embodiment, the dopant of the P-type drift region 110 includes boron and the forming method of the same includes performing an ion implantation process. The implantation energy is 220 KeV, the implantation depth is 500-1,000 nm and the dopant concentration is $4 \times 10^{12}$ cm$^{-2}$, for example.

The N-type first heavily doped region 112 and the P-type second heavily doped region 114 are disposed in the P-type drift region 110. In an embodiment, the N-type first heavily doped region 112 and the N-type second heavily doped region 106 have the same dopant, implantation energy, implantation depth and dopant concentration. Similarly, the P-type second heavily doped region 114 and the P-type first heavily doped region 108 have the same dopant, implantation energy, implantation depth and dopant concentration. However, the present disclosure is not limited thereto.

The first contact 116 is electrically connected to the N-type first heavily doped region 112. The second contact 118 is electrically connected to the P-type second heavily doped region 114. The first electrode 120 is electrically connected to the first contact 116 and the second contact 118. The third contact 122 is electrically connected to the N-type second heavily doped region 106 and the P-type first heavily doped region 108. The second electrode 124 is electrically to the gate 104 and the third contact 122. The first electrode 120 is a drain electrode (cathode), and the second electrode 124 is a source electrode (anode), for example.

Each of the first contact 116, the second contact 118 and the third contact 122 includes a conductive material and may be a primary conductive layer with a barrier layer, wherein the barrier layer is, for example, a Ti/TiN composite layer, a Ta/TaN composite layer, or any combination thereof, and the primary conductive layer is, for example, a tungsten layer, a copper layer, or an aluminum layer. Each of the first electrode 120 and the second electrode 124 includes a conductive material and may be a primary conductive layer with a barrier layer, wherein the barrier layer is, for example, a Ti/TiN composite layer, a Ta/TaN composite layer, or any combination thereof, and the primary conductive layer is, for example, a tungsten layer, a copper layer, or an aluminium layer. A metal silicide layer may be optionally disposed between the said contact and the corresponding doped region therebelow to ensure a low contact resistance and ohmic contact.

The MOS device 100 further includes an insulating layer 126. The insulating layer 126 is disposed in the P-type drift region 110 and in the N-type well region 102 and located between the gate 104 and the P-type second heavily doped region 114. The material of the insulating layer 126 is silicon oxide, for example. In an embodiment, the insulating layer 126 is a field oxide layer.

Referring to FIG. 1A, the MOS device 100 can further includes a P-type guard ring 101 surrounding the N-type well region 102. In an embodiment, in the P-type guard ring 101, a pair of gates 104 are disposed on the N-type well region 102. A pair of N-type second heavily doped regions 106 are disposed in the N-type well region 102 respectively at the outer sides of the two gates 104. P-type first heavily doped regions 108 are also disposed in pair. Moreover, each P-type first heavily doped region 108 is disposed in the N-type well region 102 between the corresponding gate 104 and the corresponding N-type second heavily doped region 106, and further surrounds the corresponding N-type second heavily doped region 106. An N-type first heavily doped region 112 is disposed between the two gates 104. A pair of P-type second heavily doped regions 114 are located between the N-type first heavily doped region 112 and the respective gates 104, and further connect to each other to surround the N-type first heavily doped region 112. Each contact 122 is electrically connected to an N-type second heavily doped region 106 and the P-type first heavily doped region 108 at two sides of the N-type second heavily doped region 106.

An equivalent circuit is also shown in FIG. 1B. Referring to FIG. 1B, in the MOS device 100, the P-type first heavily doped region 108, the N-type well region 102 and the P-type drift region 110 form a p-n-p bipolar junction transistor (BJT) Q1. Besides, the N-type well region 102, the P-type drift region 110 and the N-type first heavily doped region 112 form a vertical n-p-n BJT Q2. Meanwhile, BJT Q1 and BJT Q2 form a SCR path between the N-type first heavily doped region 112 and the P-type first heavily doped region 108, so as to distribute the current more evenly and achieve the ESD protection effect without using an ESD clamp circuit.

Figure 2A:
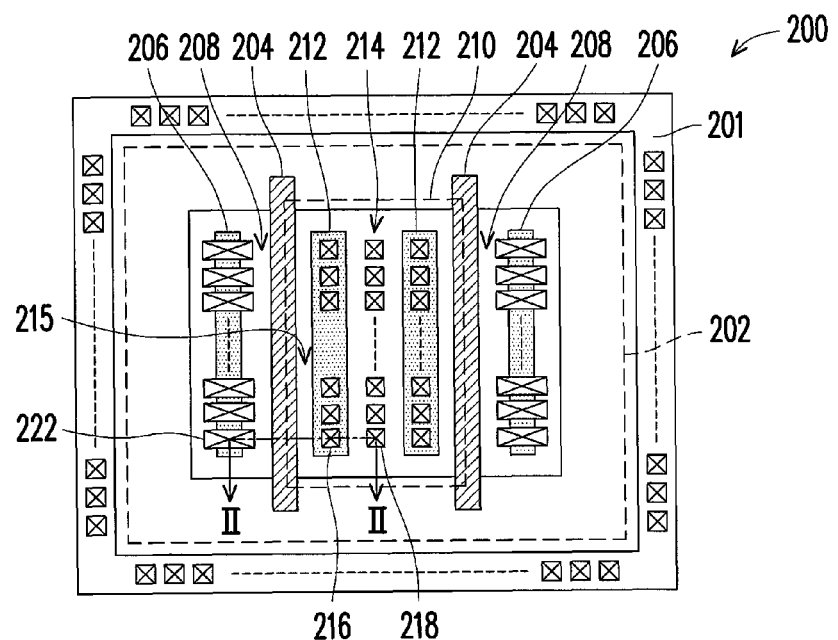
FIG. 2A illustrates a top view of a MOS device according to a second embodiment of the present disclosure.
Figure 2B:
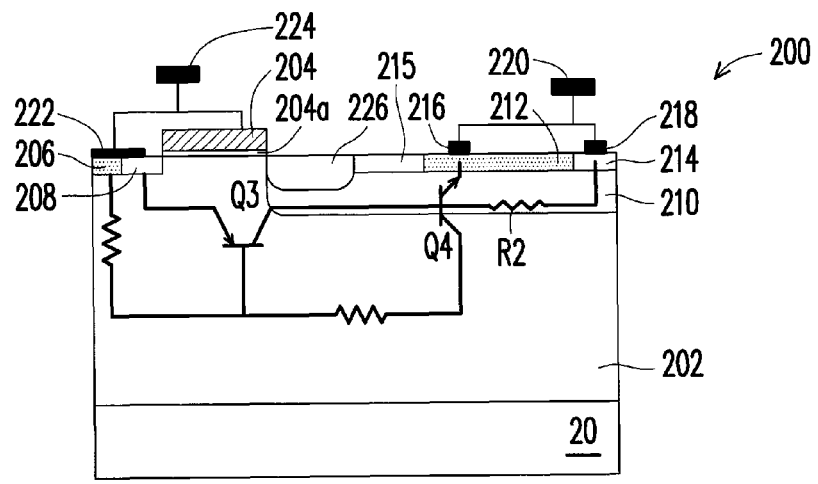
FIG. 2B illustrates a cross-sectional view taken along the line II-II in FIG. 2A.

FIG. 2A illustrates a top view of a MOS device according to a second embodiment of the present disclosure. FIG. 2B illustrates a cross-sectional view taken along the line II-II in FIG. 2A.

Referring to FIGS. 2A and 2B, a MOS device 200 of the second embodiment includes a P-type substrate 20, an N-type well region 202, a gate 204, an N-type second heavily doped region 206, a P-type first heavily doped region 208, a P-type drift region 210, an N-type first heavily doped region 212, a P-type second heavily doped region 214, a first contact 216, a second contact 218, a first electrode 220, a third contact 222 and a second electrode 224.

In the second embodiment, the N-type well region 202 is disposed in the P-type substrate 20. The gate 204 is disposed on the N-type well region 202. A gate dielectric layer 204a is further disposed between the gate 204 and the N-type well region 202. The N-type second heavily doped region 206 is disposed in the N-type well region 202 at a side of the gate 204. The P-type first heavily doped region 208 is disposed in the N-type well region 202 and located between the gate 204 and the N-type second heavily doped region 206. The P-type drift region 210 is disposed in the N-type well region 202 at another side of the gate 204. The N-type first heavily doped region 212 and the P-type second heavily doped region 214 are disposed in the P-type drift region 210, and the N-type first heavily doped region 212 is located between the gate 204 and the P-type second heavily doped region 214.

The first contact 216 is electrically connected to the N-type first heavily doped region 212. The second contact 218 is electrically connected to the P-type second heavily doped region 214, wherein the first contact 216 is the closest contact to the gate 214 on the P-type drift region 210. The first electrode 220 is electrically connected to the first contact 216 and the second contact 218. The third contact 222 is electrically connected to the N-type second heavily doped region 206 and the P-type first heavily doped region 208. The second electrode 224 is electrically to the gate 204 and the third contact 222.

The MOS device 200 further includes a P-type third heavily doped region 215 and an insulating layer 226. The P-type third heavily doped region 215 is disposed in the P-type drift region 210 and located between the gate 204 and the N-type first heavily doped region 212. No contact is disposed on the P-type third heavily doped region 215. That is, no contact is disposed between the first contact 216 and the gate 204 to electrically connect the P-type third heavily doped region 215. In an embodiment, the P-type third heavily doped region 215 and the P-type second heavily doped region 214 have the same dopant, implantation energy, implantation depth and dopant concentration. However, the present disclosure is not limited thereto. The insulating layer 226 is disposed in the N-type well region 202 and located between the gate 204 and the P-type third heavily doped region 215.

In the second embodiment, the materials, dopant species, dopant concentrations, implantation energies or depths of the P-type substrate 20, the N-type well region 202, the gate 204, the dielectric layer 204a, the N-type second heavily doped region 206, the P-type first heavily doped region 208, the P-type drift region 210, the N-type first heavily doped region 212, the P-type second heavily doped region 214, the first contact 216, the second contact 218, the first electrode 220, the third contact 222, the second electrode 224 and the insulating layer 226 can be the same as those of the P-type substrate 10, the N-type well region 102, the gate 104, the dielectric layer 104a, the N-type second heavily doped region 106, the P-type first heavily doped region 108, the P-type drift region 110, the N-type first heavily doped region 112, the P-type second heavily doped region 114, the first contact 116, the second contact 118, the first electrode 120, the third contact 122, the second electrode 124 and the insulating layer 126, and the details are not iterated herein.

Referring to FIG. 2A, the MOS device 200 can further includes a P-type guard ring 201 surrounding the N-type well region 202. In an embodiment, in the P-type guard ring 201, a pair of gates 204 are disposed on the N-type well region 202. A pair of N-type second heavily doped regions 206 are disposed in the N-type well region 202 respectively at the outer sides of the two gates 204. A pair of P-type first heavily doped regions 208 are disposed in the N-type well region 202. Moreover, each P-type first heavily doped region 208 is located between the corresponding gate 204 and the corresponding N-type second heavily doped region 206, and further surrounds the corresponding N-type second heavily doped region 206. Each contact 222 is electrically connected to an N-type second heavily doped region 206 and the P-type first heavily doped region 208 at two sides of the N-type second heavily doped region 206. In an embodiment, a pair of N-type first heavily doped regions 212 are disposed between the two gates 204, and each of them is a strip-shaped doped region. A P-type second heavily doped region 214 is disposed between the two N-type first heavily doped regions 212. P-type third heavily doped regions 215 are disposed in pair and each of them is disposed between the corresponding N-type first heavily doped region 212 and the corresponding gate 204. In an embodiment, the P-type second heavily doped region 214 and the P-type third heavily doped regions 215 extend to connect to each other to surround the two N-type first heavily doped regions 212 therein. In FIG. 2A, only two strip-shaped N-type first heavily doped regions 212 are illustrated, but the disclosure is not limited thereto. In another embodiment, more than two N-type second heavily doped regions can be disposed between the two gates upon the actual requirement and the MOS device specification.

An equivalent circuit is also shown in FIG. 2B. Referring to FIG. 2B, in the MOS device 200, the P-type first heavily doped region 208, the N-type well region 202 and the P-type drift region 210 form a p-n-p BJT Q3. Besides, the N-type well region 202, the P-type drift region 210 and the N-type first heavily doped region 212 form a vertical n-p-n BJT Q4. Meanwhile, BJT Q3 and BJT Q4 form a SCR path between the N-type first heavily doped region 212 and the P-type first heavily doped region 208, so as to achieve the ESD protection effect without using an ESD clamp circuit.

The MOS device 100 is compared with the MOS device 200 as referred to FIGS. 1B and 2B. In the MOS device 100, when an ESD phenomenon occurs, the current flows between the first electrode 120 and the second electrode 124 to activate BJT Q1. The activating current of BJT Q1 flows into the P-type drift region 110 to generate a voltage across an effective resistor R1 of the P-type drift region 110. When the voltage across the effective resistor R1 is high enough, BJT Q2 is activated (i.e. the SCR path is activated) to achieve the ESD protection effect. The mechanism to activate the ESD protection function of the MOS device 200 is similar to that of the MOS device 100, and the different lies in that Since the distance between the second contact 218 and the gate 204 of the MOS device 200 is greater than that between the second contact 118 and the gate 104 of the MOS device 100 (i.e. the effective channel length of the MOS device 200 is longer than that of the MOS device 100), an effective resistor thereof is increased. Therefore, a higher voltage can be generated across the effective resistor R2 of the P-type drift region 210 to activate the BJT Q4. Since R2 is greater than R1, the BJT Q4 can be activated faster than the BJT Q2 to improve the ESD protection effect.

In addition, the SCR path of the MOS device 100 is more difficult to activate (i.e. BJT Q2 is more difficult to activate than BJT Q4). Therefore, when an ESD phenomenon occurs, current crowding can be generated in the P-type drift region 110 before BJT Q2 is activated, thereby resulting in local hot spots having a temperature of higher than 1000K to damage the device. On the other hand, the SCR path that is easier to activate is formed in the MOS device 200 to distribute the current more evenly, so as to inhibit the said current crowding effect. According to the measurement results of transmission-line-pulsing, the MOS device of the first embodiment meets the ESD specification of 0.2 kV human body mode (HBM) and 50 V machine model (MM), and the MOS device of the second embodiment meets the ESD specification of 7.2 kV HBM and 360 V MM.

Figure 3:
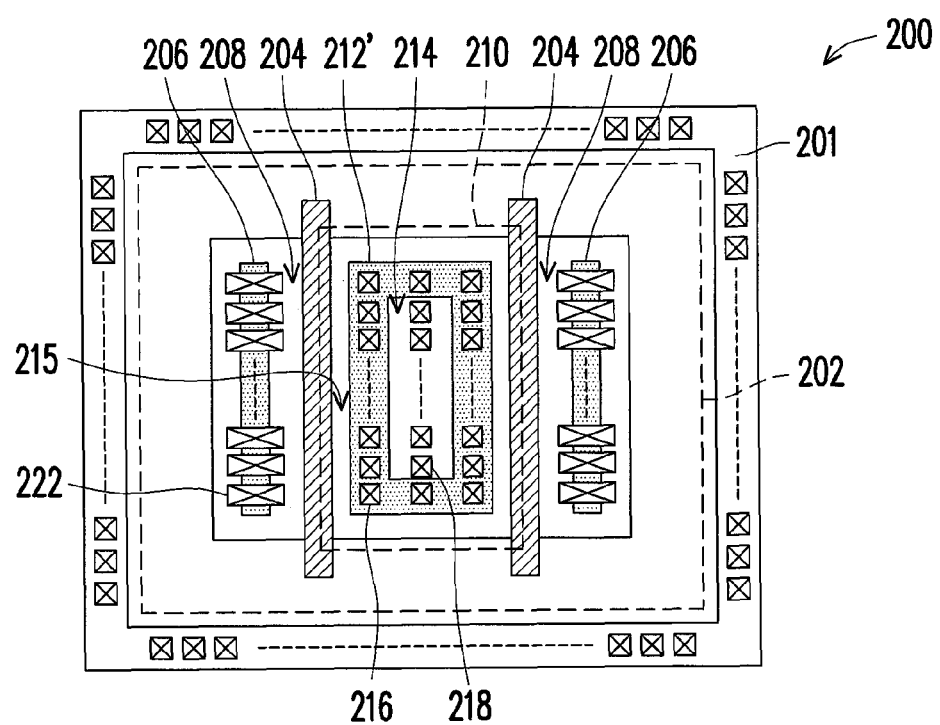
FIG. 3 illustrates a top view of another MOS device according to the second embodiment of the present disclosure.

FIG. 3 illustrates a top view of another MOS device according to the second embodiment of the present invention. In an embodiment, the N-type first heavily doped region 212' of the MOS device 200 is disposed between the two gates 204. The N-type first heavily doped region 212' is, for example, a ring-shaped doped region surrounding the P-type second heavily doped region 214. Two P-type third heavily doped regions 215 are located between the N-type first heavily doped region 212' and the respective gates 204, and further extend to connect to each other to surround the N-type first heavily doped region 212'.

The above-mentioned embodiments in which only one row of first contacts, one row of second contacts and one row of third contacts are respectively illustrated on the corresponding heavily doped region (as shown in FIGS. 1A, 2A and 3) are provided for illustration purposes, and are not construed as limiting the present disclosure. In another embodiment, multiple rows of first contacts, multiple rows of second contacts and multiple rows of third contacts are respectively illustrated on the corresponding heavily doped region. For example, in the second embodiment, multiple rows of first contacts 216 can be disposed on the N-type first heavily doped region 212 of the MOS device 200.

It is appreciated by persons skilled in the art that an N-type substrate can be used for the said embodiments without changing the conductivity types of the drift region and the doped regions. In such case, it is not necessary to form an N-type well region. Accordingly, the P-type first heavily doped region, the N-type substrate and the P-type drift region form a p-n-p BJT, and the N-type substrate, the P-type drift region and the N-type first heavily doped region form an n-p-n BJT. As described above, these two BJTs form a SCR device to achieve the ESD protection effect.

In addition, the conductivity type of each layer or region (e.g. substrate, well region or each doped region) is only provided for illustration purposes. For example, an N-type substrate can be used for the said embodiments and a P-type well region is formed in the N-type substrate. In such case, the dopant type (or conductivity type) of the drift region and each doped region is required to change correspondingly.

In summary, the present invention provides a MOS device to achieve the ESD protection effect without using an ESD clamp circuit. The present invention further provides a MOS device to distribute the current more evenly, prevent the generation of hot spots and achieve the better ESD protection effect.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A metal oxide semiconductor device, comprising:
   a substrate;
   a gate, disposed on the substrate;
   a first-type first heavily doped region, disposed in the substrate at a side of the gate;
   a first-type drift region, disposed in the substrate at another side of the gate;
   a second-type first heavily doped region, disposed in the first-type drift region;
   a contact, electrically connected to the second-type first heavily doped region, wherein the contact is a closest contact to the gate on the first-type drift region;
   a first electrode, electrically connected to the second-type first heavily doped region through the contact; and
   a second electrode, electrically connected to the first-type first heavily doped region and the gate.

2. The metal oxide semiconductor device of claim 1, wherein the second-type first heavily doped region is a strip-shaped doped region.

3. The metal oxide semiconductor device of claim 1, further comprising a first-type second heavily doped region disposed in the first-type drift region, wherein the second-type first heavily doped region is located between the first-type second heavily doped region and the gate.

4. The metal oxide semiconductor device of claim 3, wherein the second-type first heavily doped region is a ring-shaped doped region surrounding the first-type second heavily doped region.

5. The metal oxide semiconductor device of claim 3, wherein the first electrode is electrically connected the first-type second heavily doped region.

6. The metal oxide semiconductor device of claim 1, further comprising a first-type third heavily doped region disposed in the first-type drift region and located between the gate and the second-type first heavily doped region.

7. The metal oxide semiconductor device of claim 6, wherein no contact is disposed on the first-type third heavily doped region.

8. The metal oxide semiconductor device of claim 6, further comprising an insulating layer disposed in the substrate and in the first-type drift region and located between the gate and the first-type third heavily doped region.

9. The metal oxide semiconductor device of claim 8, wherein the insulating layer is a field oxide layer.

10. The metal oxide semiconductor device of claim 8, further comprising a second-type second heavily doped region disposed in the substrate, wherein the second-type second heavily doped region and the first-type first heavily doped region are located at the same side of the gate, and the first-type first heavily doped region is located between the second-type second heavily doped region and the gate.

11. The metal oxide semiconductor device of claim 10, wherein the second electrode is electrically connected to the second-type second heavily doped region.

12. The metal oxide semiconductor device of claim 1, wherein the substrate is a second-type substrate, the first-type first heavily doped region, the substrate and the first-type drift region form a first bipolar junction transistor, and the substrate, the first-type drift region and the second-type first heavily doped region form a second bipolar junction transistor.

13. The metal oxide semiconductor device of claim 12, wherein the first bipolar junction transistor and the second bipolar junction transistor form a silicon controller rectifier.

14. The metal oxide semiconductor device of claim 1, wherein the substrate is a first-type substrate, wherein the metal oxide semiconductor device further comprises a second-type well region disposed in the substrate, and wherein the first-type first heavily doped region, the second-type first heavily doped region and the first-type drift region are disposed in the second-type well region.

15. The metal oxide semiconductor device of claim 14, wherein the first-type first heavily doped region, the second-type well region and the first-type drift region form a first bipolar junction transistor, and the second-type well region, the first-type drift region and the second-type first heavily doped region form a second bipolar junction transistor.

16. The metal oxide semiconductor device of claim 15, wherein the first bipolar junction transistor and the second bipolar junction transistor form a silicon controller rectifier.

* * * * *